(12) United States Patent
Luo

(10) Patent No.: US 12,402,261 B2
(45) Date of Patent: Aug. 26, 2025

(54) BUTTON MODULE

(71) Applicant: PEGATRON CORPORATION, Taipei (TW)

(72) Inventor: Hung-Hsiang Luo, Taipei (TW)

(73) Assignee: PEGATRON CORPORATION, Taipei (TW)

(*) Notice: Subject to any disclaimer, the term of this patent is extended or adjusted under 35 U.S.C. 154(b) by 202 days.

(21) Appl. No.: 18/447,216

(22) Filed: Aug. 9, 2023

(65) Prior Publication Data

US 2024/0081006 A1    Mar. 7, 2024

(30) Foreign Application Priority Data

Sep. 5, 2022  (TW) .................................. 111133555

(51) Int. Cl.
*H05K 5/02* (2006.01)
(52) U.S. Cl.
CPC .................................. *H05K 5/0217* (2013.01)
(58) Field of Classification Search
CPC ......... H01H 2003/00; H01H 2003/007; H01H 2003/02; H01H 2003/12; H01H 2009/02; H01H 2013/00; H01H 2013/02; H01H 2013/04; H01H 2013/50; H01H 2013/52; H01H 2223/04; H01H 9/02; H01H 9/0214; H01H 9/0242; H01H 9/04; H01H 9/20; H01H 9/22; H01H 9/28; H01H 13/00; H01H 13/02; H01H 13/04; H01H 13/12; H01H 13/14; H01H 13/20; H01H 13/26; H01H 13/50; H01H 13/52; H01H 3/00; H01H 3/02; H01H 3/12; H01H 3/32; H05K 5/00; H05K 5/02; H05K 5/0217
USPC .......................................................... 200/341
See application file for complete search history.

(56) References Cited

U.S. PATENT DOCUMENTS

2014/0069794 A1* 3/2014 Lin ...................... H01H 23/02
29/622

FOREIGN PATENT DOCUMENTS

| CN | 107762313 | 3/2018 |
| CN | 211858468 | 11/2020 |
| TW | 201430887 | 8/2014 |

* cited by examiner

*Primary Examiner* — Anthony R Jimenez
(74) *Attorney, Agent, or Firm* — J.C. PATENTS

(57) ABSTRACT

A button module, including a bracket, at least one button, at least one first positioning member, and at least one elastic member, is provided. The bracket has a first surface and a second surface connected to the first surface. The button is disposed on the first surface. The first positioning member includes an elastic arm and a hook connected to the elastic arm. The elastic arm is connected to the second surface, and the hook is engaged with a casing. The elastic member protrudes from the first surface and abuts against the casing.

10 Claims, 5 Drawing Sheets

BUTTON MODULE

CROSS-REFERENCE TO RELATED APPLICATION

This application claims the priority benefit of Taiwan application serial no. 111133555, filed on Sep. 5, 2022. The entirety of the above-mentioned patent application is hereby incorporated by reference herein and made a part of this specification.

BACKGROUND

Technology Field

The disclosure relates to a button module, and in particular to a button module applicable to an electronic device.

Description of Related Art

Common electronic devices such as smart phones or tablet computers are mostly provided with power buttons and volume buttons on the sides of the casings, so that users can switch the electronic devices on or off or adjust the volume. Specifically, the side of the casing has at least two openings for accommodating the power button and the volume button, and the power button and the volume button are installed on a bracket to be fixed to the casing through the bracket.

Generally speaking, the bracket is attached to the casing through screws, which not only takes time to disassemble, but also makes it difficult to save manufacturing costs. In addition, during the process of attaching the screws to the casing, it is easy to cause the screws to be stripped or chipped due to excessive force, and even cause the bracket or the casing to break, resulting in poor assembly yield. In addition, when the user presses the power button or the volume button, the force-bearing bracket may shake due to the tolerance between the screws and screw holes, thereby affecting the operating reliability and the operating texture.

SUMMARY

The disclosure provides a button module, which not only helps to reduce the assembly working hours, but also helps to improve the operating reliability.

The disclosure provides a button module, which includes a bracket, at least one button, at least one first positioning member, and at least one elastic member. The bracket has a first surface and a second surface connected to the first surface. The button is disposed on the first surface. The first positioning member includes an elastic arm and a hook connected to the elastic arm. The elastic arm is connected to the second surface, and the hook is engaged with a casing. The elastic member protrudes from the first surface and abuts against the casing.

In an embodiment of the disclosure, a quantity of the first positioning members is two, and the elastic member is located between the two first positioning members.

In an embodiment of the disclosure, a quantity of the elastic elements is two, and the elastic elements are arranged side by side between the two first positioning members.

In an embodiment of the disclosure, the second surface has at least one groove. The elastic arm extends outward from the groove and protrudes from the first surface.

In an embodiment of the disclosure, the hook of the first positioning member protrudes from an end of the elastic arm and is located outside the groove.

In an embodiment of the disclosure, the button module further includes at least one second positioning member. The bracket further has a third surface opposite the second surface, and the first surface is connected to the second surface and the third surface. The second positioning member includes an elastic arm and a hook connected to the elastic arm. The elastic arm is connected to the third surface, and the hook is engaged with the casing.

In an embodiment of the disclosure, the third surface has at least one groove, the elastic arm of the second positioning member is located in the groove, and the hook of the second positioning member protrudes from the third surface.

In an embodiment of the disclosure, the casing has a first positioning surface, a second positioning surface opposite the first positioning surface, at least one first slot located on the first positioning surface, and at least one second slot located on the second positioning surface. The second surface of the bracket faces the first positioning surface, and the third surface of the bracket faces the second positioning surface. The hook of the first positioning member is engaged with the first slot. The hook of the first positioning member has a stopping surface abutting against an inner wall surface of the first slot. The hook of the second positioning member is engaged with the second slot. The hook of the second positioning member has a stopping surface abutting against an inner wall surface of the second slot.

In an embodiment of the disclosure, the second positioning member further includes an operating portion connected to the elastic arm of the at least one second positioning member. The bracket further has a fourth surface opposite the first surface, and the operating portion protrudes from the fourth surface.

In an embodiment of the disclosure, the elastic member includes a semicircular elastic arm, a semilunar elastic arm, or an arced elastic arm.

Based on the above, in the button module of the disclosure, the positioning member and the elastic member are integrated on the bracket, and the bracket may be fixed to the casing through the positioning member, which is not only convenient for assembly, but is also less prone to breakage of the bracket or casing due to assembly errors, so that assembly working hours can be reduced and assembly yield can be improved. On the other hand, the bracket may abut against the casing through the elastic member. When the user presses the button, the elastic member may feed back to the user a relatively solid operating texture. Moreover, based on the cooperation between the positioning member and the elastic member, the force-bearing bracket may not easily shake to reduce the idle stroke generated when pressing the button, thereby improving the operating reliability.

In order for the features and advantages of the disclosure to be more comprehensible, the following specific embodiments are described in detail in conjunction with the drawings.

DESCRIPTION OF THE EMBODIMENTS

Figure 1:
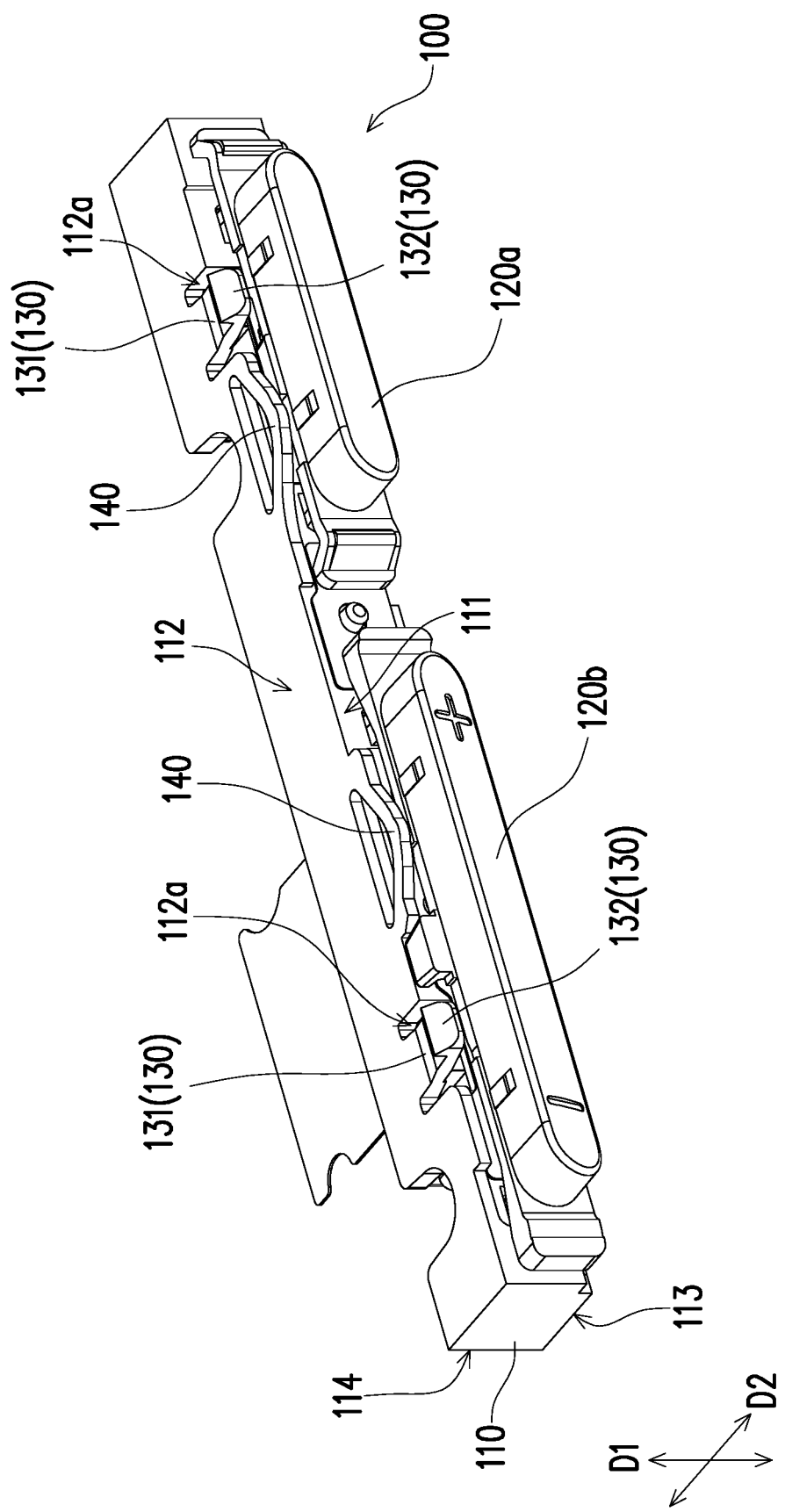
FIG. 1 and FIG. 2 are schematic views of a button module in two different viewing angles according to an embodiment of the disclosure.
Figure 2:
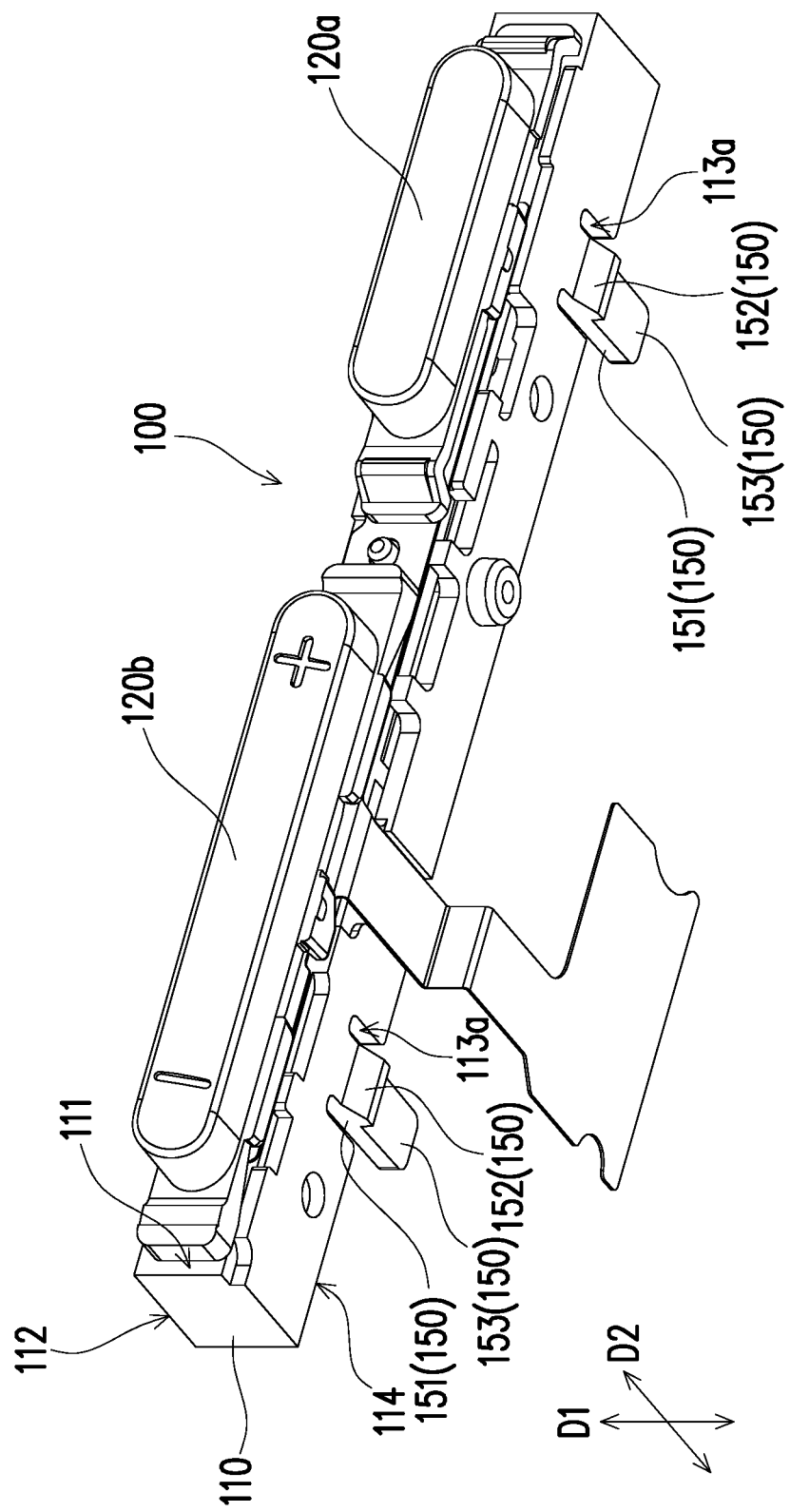
Figure 3:
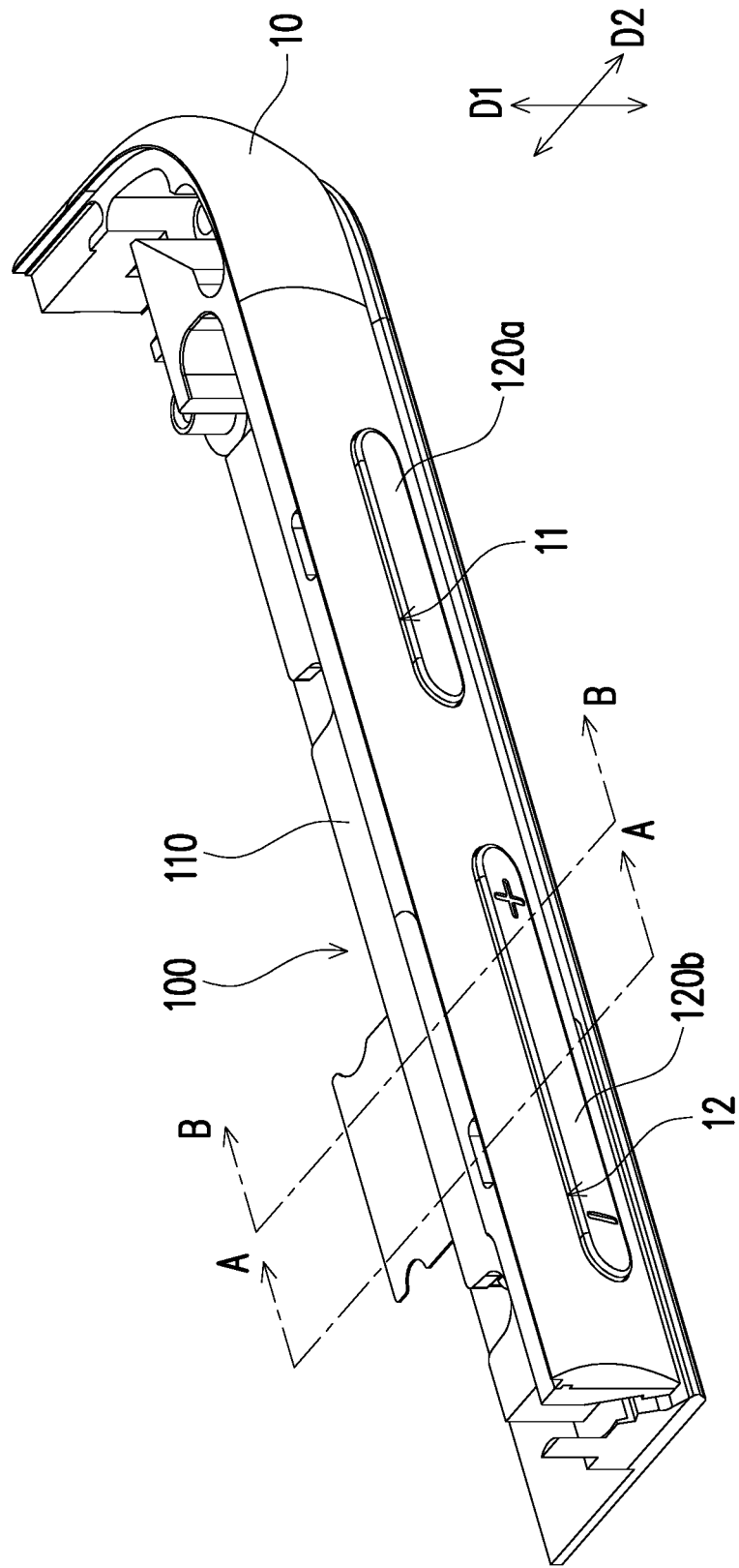
FIG. 3 is a schematic view of a button module installed on a casing according to an embodiment of the disclosure.

FIG. 1 and FIG. 2 are schematic views of a button module in two different viewing angles according to an embodiment of the disclosure. FIG. 3 is a schematic view of a button module installed on a casing according to an embodiment of the disclosure. Please refer to FIG. 1 to FIG. 3. In this embodiment, a button module 100 is applicable to be installed on a casing 10 and is fixed by adopting a screwless manner, which helps to save manufacturing costs. Specifically, the button module 100 includes a bracket 110, a first button 120a, a second button 120b, two first positioning members 130, and two elastic members 140, wherein the first button 120a and the second button 120b are arranged side by side and are installed on the bracket 110. As shown in FIG. 3, the side of the casing 10 has a first opening 11 and a second opening 12 arranged side by side, wherein the first opening 11 is configured to accommodate the first button 120a, and the second opening 12 is configured to accommodate the second button 120b. For example, the first button 120a may be a power button, and the second button 120b may be a volume button.

Figure 4:
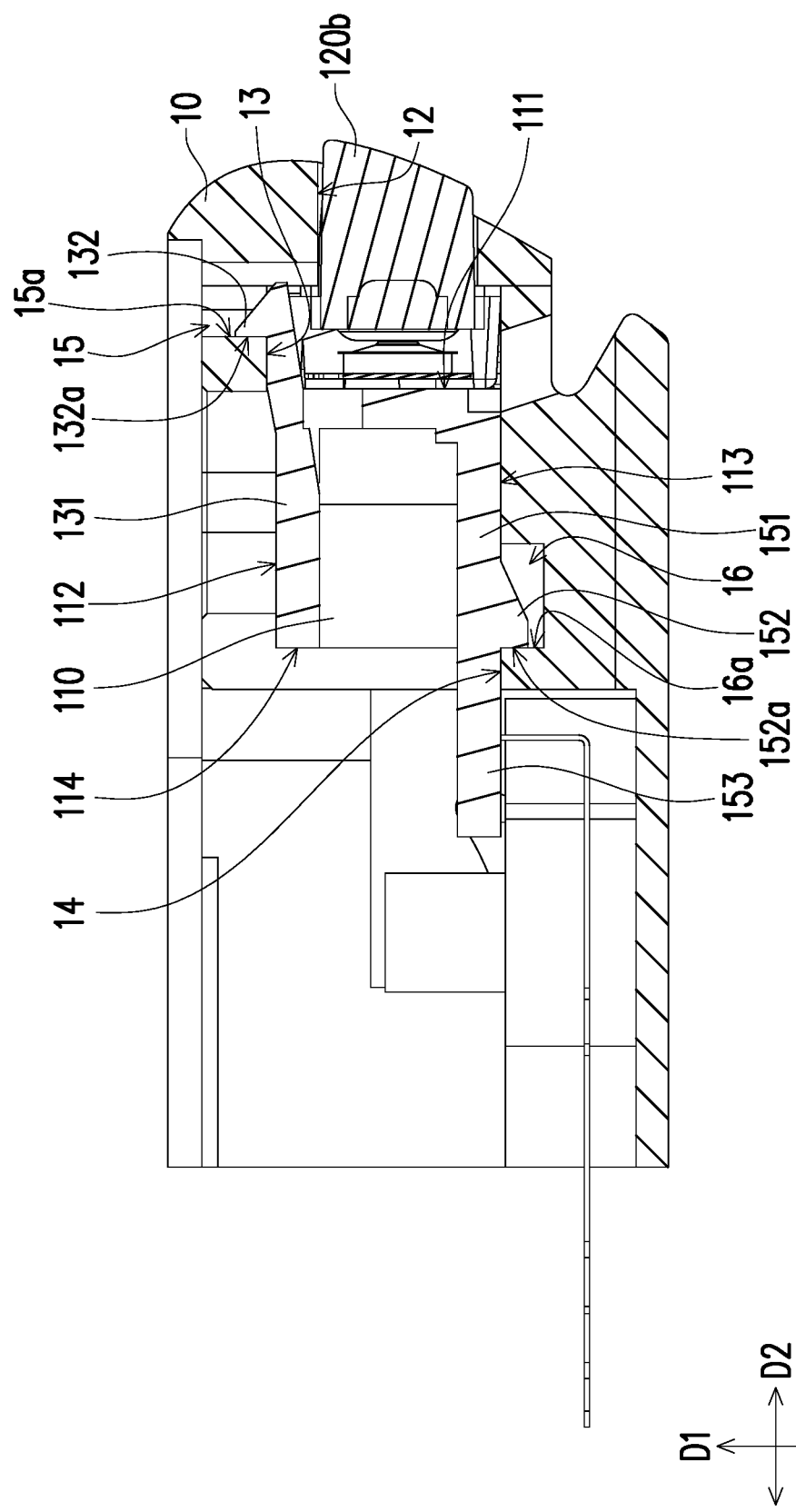
FIG. 4 is a schematic cross-sectional view of FIG. 3 along a section line A-A.
Figure 5:
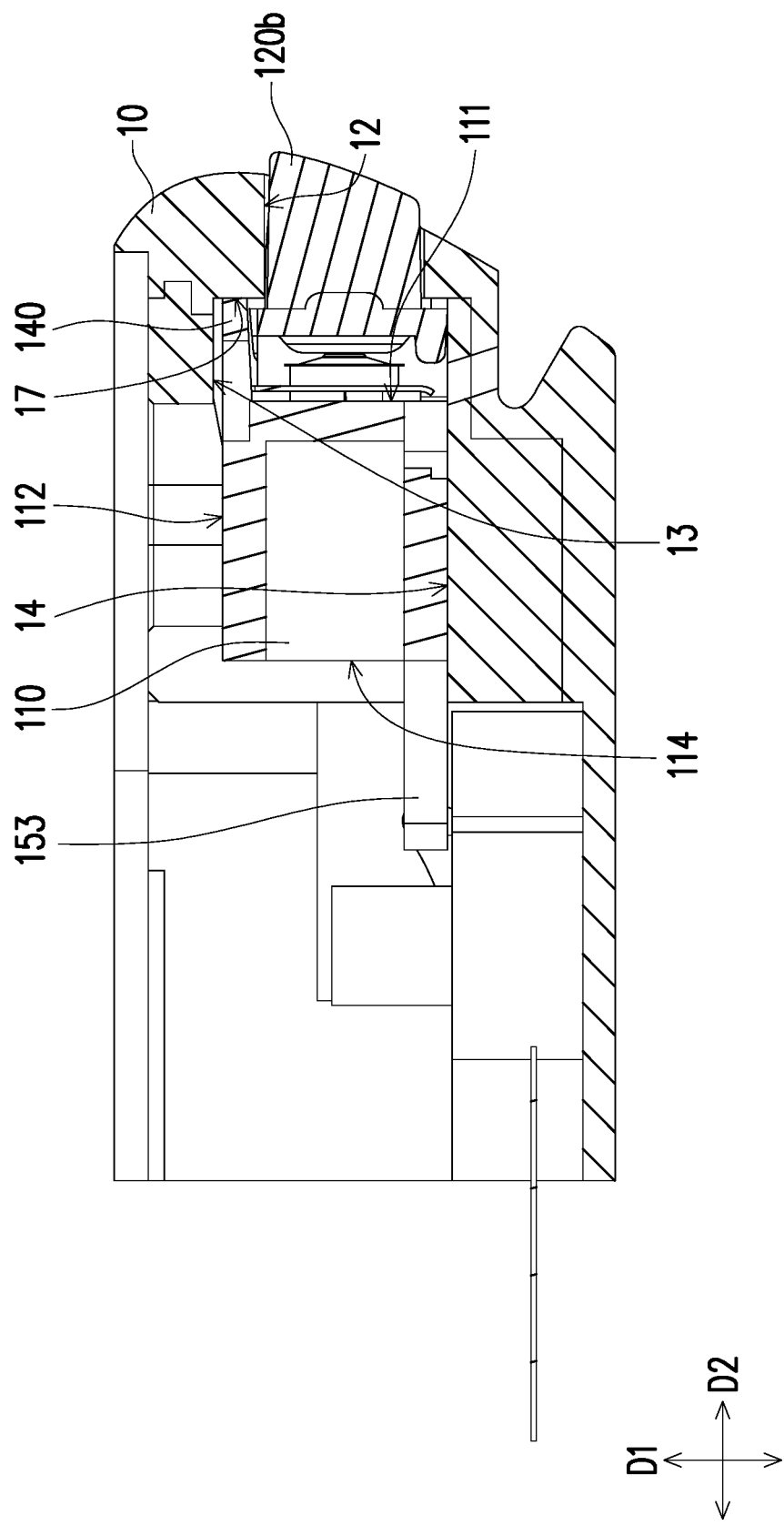
FIG. 5 is a schematic cross-sectional view of FIG. 3 along a section line B-B.

FIG. 4 is a schematic cross-sectional view of FIG. 3 along a section line A-A, and the section line A-A passes through one of the two first positioning members 130. FIG. 5 is a schematic cross-sectional view of FIG. 3 along a section line B-B, and the section line B-B passes through one of the two elastic members 140. As shown in FIG. 1, FIG. 4, and FIG. 5, the two first positioning members 130 and the two elastic members 140 are connected to the bracket 110, and the bracket 110, the two first positioning members 130, and the two elastic members 140 are an integrally formed structure, which is, for example, manufactured by plastic injection molding technology. Specifically, the bracket 110 has a first surface 111 and a second surface 112 connected to the first surface 111, wherein the first button 120a and the second button 120b are disposed on the first surface 111, and the two first positioning members 130 are connected to the second surface 112. In addition, the two elastic members 140 protrude from the first surface 111 and are arranged side by side between the two first positioning members 130. As shown in FIG. 3 to FIG. 5, when the button module 100 is installed on the casing 10, the bracket 110 is engaged with and fixed to the casing 10 through the two first positioning members 130, and abuts against the casing 10 through the two elastic members 140.

As shown in FIG. 1, FIG. 2, and FIG. 4, the button module 100 further includes two second positioning members 150 connected to the bracket 110. The bracket 110, the two first positioning members 130, the two elastic members 140, and the two second positioning members 150 are an integrally formed structure, which is, for example, manufactured by plastic injection molding technology. Furthermore, the bracket 110 further has a third surface 113 opposite the second surface 112, and the first surface 111 is connected to the second surface 112 and the third surface 113. The two second positioning members 150 are connected to the third surface 113, and the bracket 110 is engaged with and fixed to the casing 10 through the two first positioning members 130 and the two second positioning members 150. Since the bracket 110 and the casing 10 are fixed by adopting a screwless manner, manufacturing costs can be saved. In addition, it should be noted that the section line A-A passes through one of the two second positioning members 150.

As shown in FIG. 1, FIG. 2, and FIG. 4, the casing 10 has a first positioning surface 13, a second positioning surface 14 opposite the first positioning surface 13, two first slots 15 located on the first positioning surface 13, and two second slots 16 located on the second positioning surface 14. The second surface 112 of the bracket 110 faces the first positioning surface 13 of the casing 10, and the third surface 113 faces the second positioning surface 14. The two first positioning members 130 abut against the first positioning surface 13 and are engaged with the two first slots 15. In contrast, the two second positioning members 150 abut against the second positioning surface 14 and are engaged with the two second slots 16.

As shown in FIG. 3 and FIG. 4, the bracket 110 is clamped and positioned between the first positioning surface 13 and the second positioning surface 14 of the casing 10. When the user presses the first button 120a or the second button 120b, the force-bearing bracket 110 may not easily shake in a first direction D1, and therefore the idle stroke generated when the first button 120a or the second button 120b are pressed is mitigated, thereby improving the operating reliability. In the embodiment of the present invention, the first direction D1 is perpendicular to the first positioning surface 13, the second positioning surface 14, the second surface 112, or the third surface 113.

As shown in FIG. 1 to FIG. 4, the bracket 110 is engaged with and fixed to the casing 10 through the two first positioning members 130 and the two second positioning members 150, which is not only convenient for assembly, but also less prone to breakage of the bracket 110 or the casing 10 due to assembly mistakes, so that assembly time can be reduced and assembly yield can be improved. As shown in FIG. 1, FIG. 3, and FIG. 5, the bracket 110 abuts against the casing 10 through the two elastic members 140. When the user presses the first button 120a or the second button 120b, the two elastic members 140 may feed back to the user a relatively solid operating texture.

As shown in FIG. 3 to FIG. 5, based on the cooperation between the first positioning member 130 and the elastic member 140 and the cooperation between the second positioning member 150 and the elastic member 140, the force-bearing bracket 110 may not easily shake in a second direction D2 perpendicular to the first direction D1 (or parallel to the pressing direction of the button), so the idle stroke generated when the first button 120a or the second button 120b is pressed is mitigated, thereby improving the operating reliability.

As shown in FIG. 1 and FIG. 4, in this embodiment, each first positioning member 130 includes an elastic arm 131 and a hook 132. The elastic arm 131 is connected to the second surface 112, and the hook 132 is connected to the elastic arm 131. In detail, the second surface 112 has two grooves 112a configured to accommodate the two elastic arms 131 of the two first positioning members 130. The two elastic arms 131 extend outward from the two grooves 112a and protrude from the first surface 111. In addition, each hook 132 protrudes from an end of the corresponding elastic arm 131 and is located outside the corresponding groove 112a. The hook 132 of each first positioning member 130 is engaged with the corresponding first slot 15, and the elastic arm 131 abuts against the first positioning surface 13 of the casing 10.

As shown in FIG. 2 and FIG. 4, each second positioning member 150 includes an elastic arm 151 and a hook 152. The elastic arm 151 is connected to the third surface 113, and the hook 152 is connected to the elastic arm 151. In detail, the third surface 113 has two grooves 113a configured to accommodate the two elastic arms 151 of the two second positioning members 150. In addition, the hook 152 of each second positioning member 150 protrudes outward from the corresponding elastic arm 151 and protrudes from the third surface 113. The hook 152 of each second positioning member 150 is engaged with the corresponding second slot 16, and the elastic arm 151 abuts against the second positioning surface 14 of the casing 10.

As shown in FIG. 3 and FIG. 4, due to the abutting relationship between the elastic arm 131 of each first positioning member 130 and the first positioning surface 13 of the casing 10 and the abutting relationship between the elastic arm 151 of each second positioning member 150 and the second positioning surface 14 of the casing 10, the force-bearing bracket 110 may not easily shake in the first direction D1, so the idle stroke generated when the first button 120a or the second button 120b is pressed is mitigated.

As shown in FIG. 4, the hook 132 of each first positioning member 130 has a stopping surface 132a abutting against an inner wall surface 15a of the corresponding first slot 15. Similarly, the hook 152 of each second positioning member 150 has a stopping surface 152a abutting against an inner wall surface 16a of the corresponding second slot 16. As shown in FIG. 3 and FIG. 4, by the abutting relationship between the hook 132 of each first positioning member 130 and the corresponding first slot 15 and the abutting relationship between the hook 152 of each second positioning member 150 and the corresponding second slot 16, the force-bearing bracket 110 may not easily shake in the second direction D2, and the idle stroke generated when the first button 120a or the second button 120b is pressed is mitigated.

As shown in FIG. 3 to FIG. 5, the casing 10 also has an inner surface 17 located between the first positioning surface 13 and the second positioning surface 14. Each elastic member 140 abuts against the inner surface 17 and may be in a compressed state to strengthen the engaging relationship between the first positioning member 130 and the casing 10, and the engaging relationship between the second positioning member 150 and the casing 10 through the elastic restoring force of the elastic member 140, so that the force-bearing bracket 110 may not easily shake in the second direction D2, so the idle stroke generated when the first button 120a or the second button 120b is pressed is mitigated. As shown in FIG. 1, the elastic member 140 may be a semicircular elastic arm, a semilunar elastic arm, or an arced elastic arm.

As shown in FIG. 2 and FIG. 4, in this embodiment, each second positioning member 150 further includes an operating portion 153, which is connected to the elastic arm 151, and the hook 152 is located approximately at a junction of the operating portion 153 and the elastic arm 151. On the other hand, the bracket 110 also has a fourth surface 114 opposite the first surface 111. The operating portion 153 is located outside the groove 113a and protrudes from the fourth surface 114.

For an operator, the operating portion 153 may be used as a force application point for disengaging the engaging relationship between the second positioning member 150 and the casing 10, and the operator may first apply force to pull the operating portion 153 of the two second positioning members 150, so that the two hooks 152 are moved out of the two second slots 16 of the casing 10. Next, the two hooks 132 of the two first positioning members 130 are moved out of the two first slots 15 of the casing 10. After completely disengaging the engaging relationship between the bracket 110 and the casing 10, the operator may disassemble the button module 100 from the casing 10, so the disassembly and assembly are very convenient.

In particular, although the quantities of the first positioning member 130, the elastic member 140, the second positioning member 150, the first slot 15, the second slot 16, the groove 112a, and the groove 113a have been illustrated as above, the quantities are not limited thereto. In other embodiments, the quantities of the first positioning member 130, the elastic member 140, the second positioning member 150, the first slot 15, and the second slot 16 may be increased or decreased according to design requirements.

In summary, in the button module of the disclosure, the positioning member and the elastic member are integrated on the bracket, and the bracket may be fixed to the casing through the positioning member, which is not only convenient for assembly, but also less prone to breakage of the bracket or casing due to assembly errors, so that assembly time can be reduced and assembly yield can be improved. On the other hand, the bracket may abut against the casing through the elastic member. When the user presses the button, the elastic member may feed back to the user a relatively solid operating texture. Moreover, based on the cooperation between the positioning member and the elastic member, the force-bearing bracket may not easily shake, and therefore the idle stroke generated when the button is pressed is mitigated, thereby improving the operating reliability. In addition, the bracket and the casing are fixed by adopting a screwless manner, which helps to save manufacturing costs.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:
1. A button module, comprising:
 a bracket, having a first surface and a second surface connected to the first surface;
 at least one button, disposed on the first surface;
 at least one first positioning member, comprising an elastic arm and a hook connected to the elastic arm, wherein the elastic arm is connected to the second surface, and the hook is engaged with a casing; and
 at least one elastic member, protruding from the first surface and abutting against the casing.
2. The button module according to claim 1, wherein the at least one elastic member comprises a semicircular elastic arm, a semilunar elastic arm, or an arced elastic arm.
3. The button module according to claim 1, wherein the at least one first positioning member comprises two first positioning members, and the at least one elastic member is located between the two first positioning members.
4. The button module according to claim 3, wherein the at least one elastic member comprises two elastic members, and the two elastic members are arranged side by side between the two first positioning members.
5. The button module according to claim 1, wherein the second surface has at least one groove, and the elastic arm extends outward from the at least one groove and protrudes from the first surface.
6. The button module according to claim 5, wherein the hook protrudes from an end of the elastic arm and is located outside the at least one groove.
7. The button module according to claim 1, further comprising:

at least one second positioning member, wherein the bracket further has a third surface opposite the second surface, the first surface is connected to the second surface and the third surface, and the at least one second positioning member comprises an elastic arm and a hook connected to the elastic arm, wherein the elastic arm of the at least one second positioning member is connected to the third surface, and the hook of the at least one second positioning member is engaged with the casing.

8. The button module according to claim 7, wherein the third surface has at least one groove, the elastic arm of the at least one second positioning member is located in the at least one groove of the third surface, and the hook of the at least one second positioning member protrudes from the third surface.

9. The button module according to claim 7, wherein the casing has a first positioning surface, a second positioning surface opposite the first positioning surface, at least one first slot located on the first positioning surface, and at least one second slot located on the second positioning surface, the second surface of the bracket faces the first positioning surface, the third surface of the bracket faces the second positioning surface, and the hook of the at least one first positioning member is engaged with the at least one first slot, wherein the hook of the at least one first positioning member has a stopping surface abutting against an inner wall surface of the at least one first slot, and the hook of the at least one second positioning member is engaged with the at least one second slot, wherein the hook of the at least one second positioning member has a stopping surface abutting against an inner wall surface of the at least one second slot.

10. The button module according to claim 7, wherein the at least one second positioning member further comprises an operating portion, the operating portion is connected to the elastic arm of the at least one second positioning member, the bracket further has a fourth surface opposite the first surface, and the operating portion protrudes from the fourth surface.

* * * * *